(12) United States Patent
Elyada

(10) Patent No.: US 9,143,157 B1
(45) Date of Patent: Sep. 22, 2015

(54) DYNAMIC GAIN SWITCHING DIGITAL TO ANALOG CONVERTER

(71) Applicant: DSP Group LTD.

(72) Inventor: Ori Elyada, Bnei Zion (IL)

(73) Assignee: DSP GROUP LTD., Herzeliya (IL)

( * ) Notice: Subject to any disclaimer, the term of this patent is extended or adjusted under 35 U.S.C. 154(b) by 0 days.

(21) Appl. No.: 14/630,817

(22) Filed: Feb. 25, 2015

Related U.S. Application Data

(60) Provisional application No. 61/946,808, filed on Mar. 2, 2014.

(51) Int. Cl.
 *H03M 1/66* (2006.01)
 *H03M 1/70* (2006.01)
 *H03M 1/00* (2006.01)
 *H03M 1/08* (2006.01)

(52) U.S. Cl.
 CPC ............... *H03M 1/70* (2013.01); *H03M 1/002* (2013.01); *H03M 1/0845* (2013.01)

(58) Field of Classification Search
 CPC ....... H03G 3/02; H03G 3/3005; H03G 3/301; H03G 3/3078; H03G 3/3052; H03G 3/70; H03G 3/9845; H03M 1/66; H03M 1/70; H03M 3/51
 USPC .......... 341/145–153; 455/73, 239.1; 330/129, 330/141, 86, 133, 151; 375/345
 See application file for complete search history.

(56) References Cited

U.S. PATENT DOCUMENTS

| | | | | |
|---|---|---|---|---|
| 5,008,631 A * | 4/1991 | Scherer et al. | .................. | 330/51 |
| 5,617,060 A * | 4/1997 | Wilson et al. | ................. | 330/129 |
| 5,659,313 A * | 8/1997 | Dischert et al. | ............... | 341/132 |
| 6,107,878 A * | 8/2000 | Black | ............................ | 330/129 |
| 6,137,533 A * | 10/2000 | Azim | ......................... | 348/222.1 |
| 2012/0188111 A1* | 7/2012 | Ledzius et al. | ................ | 341/144 |
| 2012/0288119 A1* | 11/2012 | Apfel | ............................ | 381/101 |
| 2013/0102259 A1* | 4/2013 | Son et al. | ........................ | 455/73 |
| 2013/0106635 A1* | 5/2013 | Doi | ................................ | 341/144 |

* cited by examiner

*Primary Examiner* — Lam T Mai

(74) *Attorney, Agent, or Firm* — Reches Patents

(57) ABSTRACT

A digital to analog converter that may include a digital gain block; an analog gain block; a digital to analog conversion (DAC) block and a controller that is configured to: determine a digital gain factor, selected out of multiple digital gain factors, of the digital gain block and an analog gain factor, selected out of multiple analog gain factors of the analog gain block; wherein the DAC block is preceded by the digital gain block and is followed by the analog gain block; wherein the digital gain block is configured to multiply a digital input signal by the digital gain factor to provide an intermediate digital signal; wherein the DAC block is configured to convert the intermediate digital signal to a converted analog signal; and wherein the analog gain block is configured to multiply the converted analog signal by the analog gain factor to provide an output signal; wherein an increment of the analog gain factor results in a decrement of the digital gain factor.

20 Claims, 9 Drawing Sheets

PRIOR ART

PRIOR ART

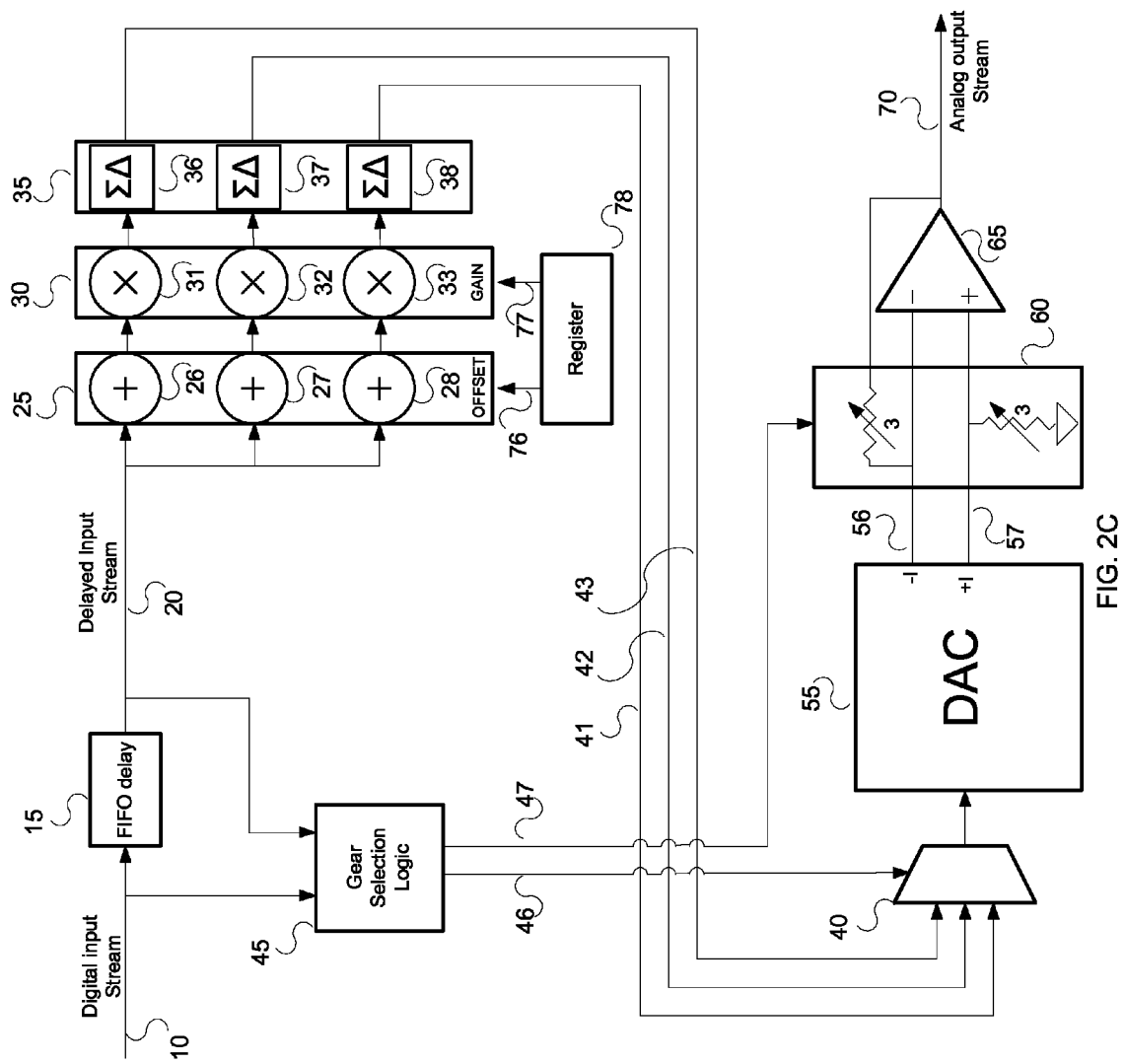

DYNAMIC GAIN SWITCHING DIGITAL TO ANALOG CONVERTER

RELATED APPLICATIONS

This application claims priority from U.S. provisional patent Ser. No. 61/946,808, filing date Mar. 2, 2014 which is incorporated herein by reference.

FIELD OF THE INVENTION

This invention relates to the field of low noise digital to analog converters.

BACKGROUND OF THE INVENTION

Digital to analog converters (DAC) are used at the end of a digital processing chain where analog signal reproduction is required. Such uses include digital audio devices such as Compact Disc/MP3 players, HD radio and digital telephones. In all these applications, it is highly desirable to achieve a high signal to noise ratio (SNR) at the analog output while achieving the required, maximum high output signal level. In DAC applications, SNR is defined as the ratio between RMS of maximum amplitude output divided by the RMS of the integrated noise floor with no signal present and integrated within the frequency band of interest. SNR is usually specified in decibels (dB). For example, specifications for SNR of greater than 100 dB is common in smartphones and digital telephones and with modern sensitive headphones, a requirement for 120 dB is now considered state-of the-art.

Electronic noise is inherent in all analog circuits. Higher supply power (supply voltage and/or quiescent current) is traditionally used to lower noise floor and increase SNR. In mobile applications however, battery capacity limits available supply power and power consumption must be minimized.

The analog output of a DAC may be a voltage or a current. Most modern current-output DACs usually have differential outputs in order to achieve high common-mode and power-supply rejection and to reduce even-order distortion. An example of a DAC with differential current outputs and an operational amplifier differential to single ended converter is shown in FIG. 1A. An operational amplifier 203 connected as a differential to single-ended converter is often used to obtain a single ended voltage output across the desired frequency range. The amplifier 203 acts as a transimpedance amplifier. In this example, the output voltage, Vout, has a value of $Vout=(Iout_+-Iout_-)\times R$, where $Iout_+$ and $Iout_-$ are the complementary current outputs from the DAC 201 and R is the value in ohms of the feedback resistor FR 202 connected output and the inverting input of the operational amplifier and also for the shunt resistor SR 204 (of value R) that is connected from the non-inverting input of the operational amplifier to ground, as shown in the FIG. 1A below.

The transimpedance $Vout/(Iout_+-Iout_-)$ of this connection is equal to R ohms, in other words $Vout=(Iout_+-Iout_-)\times R=2\times Iout_+\times R$. Also it should be noted that for this example, the voltage at both of the inputs of the operational amplifier is $Vin_-=Vin_+=Iout_+\times R$ volts. The voltage gain of the amplifier, $Av=Vout/Vin$, is therefore equal to two.

There are many variations of transimpedance amplifiers but for each the prime parameters of interest are the transimpedance and the voltage gain.

One common alternative to the single ended amplifier transimpedance stage is a Differential-Input-to-Differential-Output "DIDO" amplifier acting as a differential output transimpedance stage which is in some cases followed by a second differential-to-single-ended voltage amplifier.

Another alternative to the current-output DAC with a transimpedance stage is a voltage-output DAC followed by a voltage amplifier or buffer.

Additionally, in some applications, the output may be current and not voltage.

There are three major sources of output voltage noise in a circuit comprising of a DAC with current outputs followed by a transimpedance amplifier. First the current noise, present at the output of the DAC, is converted to voltage noise at the output of the transimpedance amplifier. Second there is the resistor noise, thermal and flicker, which is related to the value of the transimpedance. Third there is the amplifier input referred noise that is created primarily in the input stages of the amplifier and which is not related to the value of the transimpedance. All three noise sources mentioned are further amplified to the output by the closed loop voltage gain of the amplifier.

There are a multitude of amplifier and DAC designs and the relevant design criteria are determined by the requirements of maximum output voltage range, maximum voltage range of the amplifier inputs and of the DAC outputs, and current output range of DAC, and in each case the design will tend towards a trade-off between the supply power and output noise when meeting the maximum amplitude requirement.

In practice, the noise floor is more apparent when the output signal is low, but the design for the transimpedance amplifier is ultimately set by the required gain and highest output signal that is required. In the example, the transimpedance is R, the output $Vout=(Iout_+-Iout_-)\times R$, and the input voltage to the op amp is $Iout_+\times R$. The value for the transimpedance is set by the highest required output given the maximum Iout from the DAC, which in turn determines the value for the noise due to the transimpedance. As previously stated, the lower the value for the transimpedance, or R as depicted in the example, and the lower the voltage gain, the lower is the noise floor. The value for the transimpedance, or R in the example, must be set high enough such that the gain is sufficient to produce an output signal at a level to meet the highest output requirement for the application. This results in a practical limit to the noise floor when limited by DAC and amplifier power consumption.

Another consideration is that the signal voltage range at the input to the operational amplifier needs to be such that the amplifier input stage can safely operate without introducing distortion. In many cases the DAC architecture also imposes similar limits on its output voltage range. Therefore, in order to keep the signal voltage at the input of the transimpedance amplifier within limits set by the architecture and supply voltages, while supporting large output signals, Vout, it may be necessary to have a higher voltage gain across the amplifier. The problem is that increased voltage gain also amplifies the noise at the output of the amplifier. For example, the circuit shown in FIG. 1B is again an example of a DAC 201 with differential current outputs and an operational amplifier 203 differential to single ended converter, but in this case there is a higher voltage gain and hence a lower signal at the input of the operational amplifier for the same output signal voltage. The positive input of operational amplifier 203 is shunted to ground via shunt resistor SR 204 having an impedance of R/2 while the negative input of operational amplifier 203 is shunted to ground via shunt resistor SR 205 having an impedance of R while the feedback resistor FR 202 also has an impedance of R.

In this second example, the output signal is the same as in the first example $Vout=(Iout_+-Iout_-)\times R$, but the signal voltage at the inputs of the operational amplifier is now Vin=Iout$_+$×R/2, half that of the previous example. Alternatively, the lower input signal allows the value of R to be increased and hence the maximum output signal to be raised while keeping the input signals to the operational amplifier at levels that do not require high supply voltages to the amplifier input stage and DAC output. The point to note is that in order to cater for the large output signal requirement, not only is the value of R increased and hence the transimpedance R increased and, in turn, the resistive noise level, but also that the amplifier now has increased voltage gain which in turn increases the noise floor at the output from all three major noise sources by 6 dB.

The need to meet the gain criteria using the transimpedance amplifier effectively sets a limit on the noise levels and the result is that the desired noise levels and hence the signal to noise ratio of the output signal for state-of-the-art applications and devices is difficult to meet.

In other cases of DAC architectures such as voltage-mode DACs, similar noise analysis can be performed and similar design issues limit SNR

SUMMARY OF THE INVENTION

According to an embodiment of the invention there may be provided a method for digital to analog conversion, the method may include receiving a digital input signal by a digital to analog converter; determining, by a controller, a digital gain factor of the digital gain block and an analog gain factor of an analog gain block; digitally multiplying, by the digital gain block, the digital input signal by the digital gain factor to provide an intermediate digital signal; converting, by a digital to analog conversion (DAC) block, the intermediate digital signal to a converted analog signal; and multiplying, by the analog gain block, the converted analog signal by the analog gain factor to provide an output signal.

According to an embodiment of the invention there may be provided a digital to analog converter that may include a digital gain block; an analog gain block; a digital to analog conversion (DAC) block and a controller that may be configured to determine a digital gain factor, selected out of multiple digital gain factors, of the digital gain block and an analog gain factor, selected out of multiple analog gain factors of the analog gain block; wherein the DAC block may be preceded by the digital gain block and may be followed by the analog gain block; wherein the digital gain block may be configured to multiply a digital input signal by the digital gain factor to provide an intermediate digital signal; wherein the DAC block may be configured to convert the intermediate digital signal to a converted analog signal; and wherein the analog gain block may be configured to multiply the converted analog signal by the analog gain factor to provide an output signal; wherein an increment of the analog gain factor results in a decrement of the digital gain factor.

A product of a multiplication of the analog gain factor by the digital gain factor approximately equals a predetermined constant.

The controller may be configured to determine the digital gain factor in response to an attribute of at least one signal out of the digital input signal, the intermediate digital signal and the output signal.

The attribute may be a level of the digital input signal.

The attribute may be an amplitude of the digital input signal.

The attribute may be a derivative of the digital input signal.

The digital to analog converter may be configured to generate a first analog signal representative of the first digital input signal; wherein the controller may be configured to determine the a digital gain factor in response to the first analog signal.

The digital gain block may include multiple digital amplifying paths that have different digital gain factors; wherein the determination, by the controller, of the digital gain factor may be followed by selecting a selected digital amplifying path of the multiple digital amplifying paths.

The analog gain block may include an analog amplifying path that has an adjustable analog gain; wherein the determination, by the controller, of the analog gain factor may be followed by adjusting the analog gain of the adjustable analog gain factor.

The controller may be configured to determine whether to replace a previous value of the digital gain factor by a current value of the digital gain factor.

The controller may be configured to determine a timing of the replacement of the previous value of the digital gain factor by the current value of the digital gain factor.

The controller may be configured to determine the timing of the replacement in response to a level of digital input signal.

The controller may be configured to determine the timing of the replacement in response to a timing of a zero crossing event during which a level of the digital input signal may be about zero.

The controller may be configured to set at least a predetermined period between consecutive replacements of values of the digital gain factor.

The controller may be configured to set a first predetermined period prior to a decrement of the digital gain factor and set a second predetermined period prior to an increment of the digital gain factor.

The DAC block may include the analog gain block.

The digital gain block may include a gain multiplication circuit and an offset circuit for providing an offset signal to the input digital signal.

The digital gain block may include a digital amplifying path that has an adjustable digital gain; wherein a determination, by the controller, of the digital gain factor may be followed by adjusting the digital gain of the adjustable digital gain factor.

The analog gain block may include multiple analog amplifying paths that have different analog gain factors; wherein the determination, by the controller, of the analog gain factor may be followed by selecting a selected analog amplifying path of the multiple analog amplifying paths.

BRIEF DESCRIPTION OF DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2C is a block schematic diagram of a second embodiment using the proposed DAC gear scheme.

DETAILED DESCRIPTION OF THE INVENTION

Figure 1A:
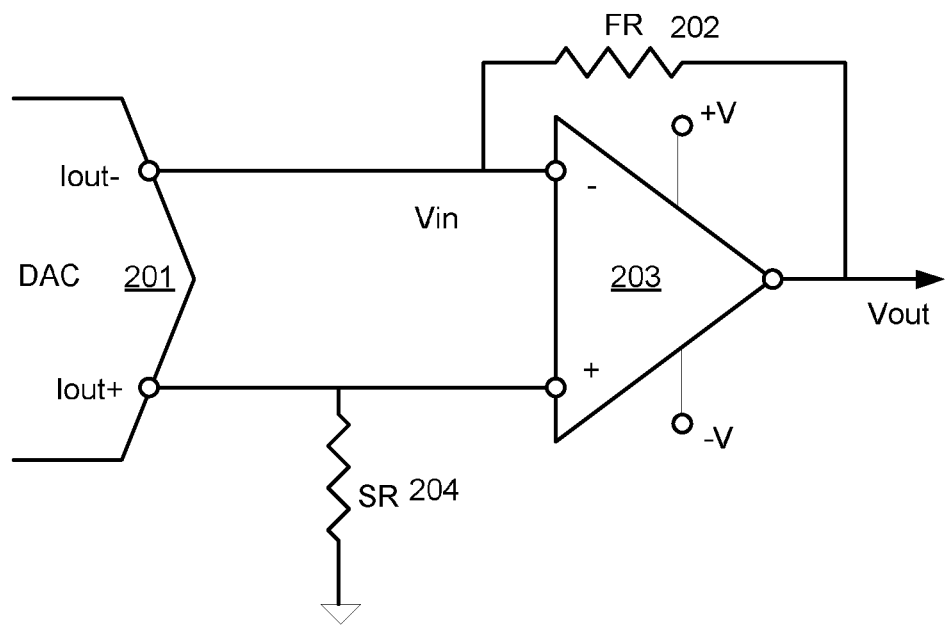
FIG. 1A illustrates a prior art digital to analog converter.
Figure 1B:
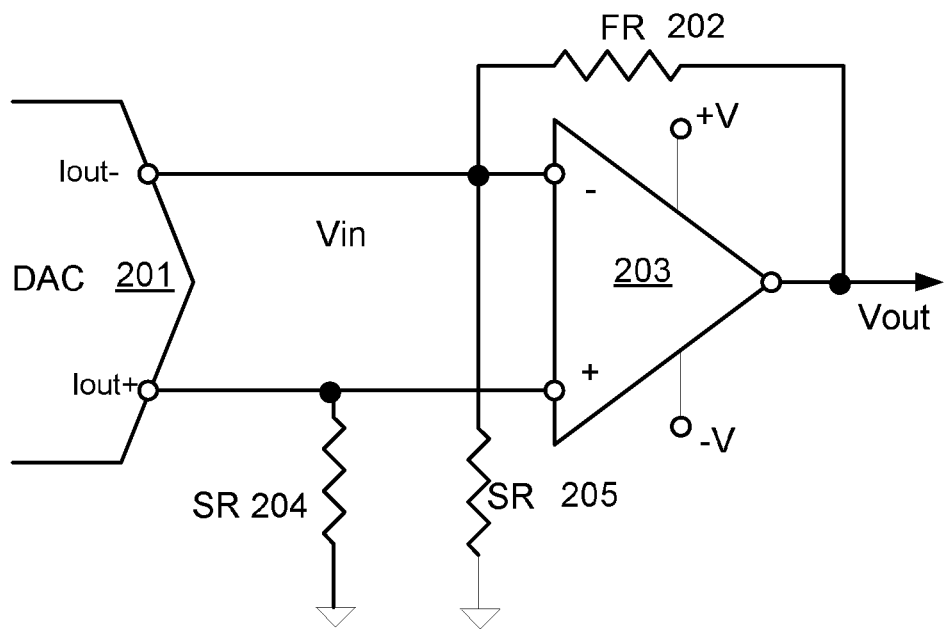
FIG. 1B illustrates a prior art digital to analog converter.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

In order to overcome the high noise caused by relatively high transimpedance values when using differential output current DACs or when using any other type of DACs a scheme is proposed that dynamically controls the trade-off between signal level, voltage gain and transimpedance. To illustrate the scheme an example using three transimpedance amplifier connections will be used, as shown in FIG. 1C.

Figure 1C:
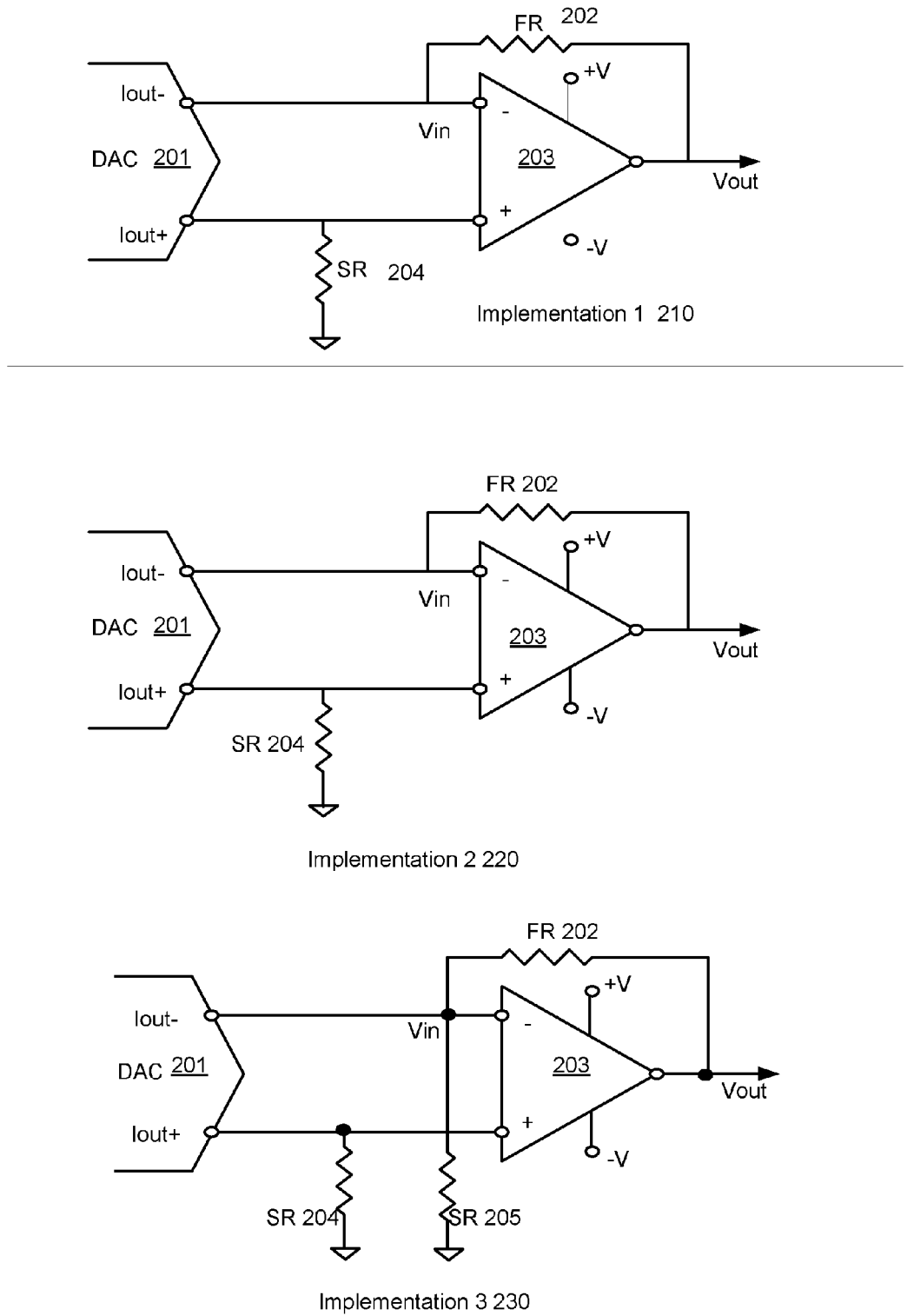
FIG. 1C illustrates three trans-impedance amplifier connections.

FIG. 1C illustrates three implementations, each includes a differential DAC 201 followed by an operational amplifier 203 that is connected to a feedback resistor and one or more shunt resistors.

In implementation 1 feedback resistors FR 202 (having a resistance of R) is connected between the output and the inverting input of the operational amplifier, and shunt resistor SR 204 (having a resistance of R) is connected between the non-inverting input of the operational amplifier and ground.

In implementation 2 feedback resistor FR 202 (having a resistance of 4R) is connected between the output and the inverting input of the operational amplifier and shunt resistor 204 (having a resistance of 4R) is connected between the non-inverting input of the operational amplifier and ground.

In implementation 3 the feedback resistor FR 202 (having a resistance of 8R) is connected between the output and the inverting input of the operational amplifier. A first shunt resistor SR 204 (having a resistance of 4R) is connected between the non-inverting input of the operational amplifier and ground. And a second shunt resistor SR 205 (having a resistance of 8R) is connected between the inverting input of the operational amplifier and ground.

The characteristics of the three configurations are summarized in the following Table:

| Implementation | Vout Amplitude | Trans-impedance | Vin Amplitude | Amplifier voltage gain | Relative Analog Gain |
|---|---|---|---|---|---|
| 1 | R × (Iout$_+$ − Iout$_-$) | R | Iout$_+$ × R | 2 | 1/8 |
| 2 | 4R × (Iout$_+$ − Iout$_-$) | 4R | Iout$_+$ × 4R | 2 | 1/2 |
| 3 | 8R × (Iout$_+$ − Iout$_-$) | 8R | Iout$_+$ × 4R | 4 | 1 |

Implementation 3 has the highest gain and is configured to satisfy the required maximum output signal, which corresponds to the maximum current output from the DAC. As can be seen, implementation 3 has the highest transimpedance and the highest voltage gain and hence will also have the highest noise floor. If the digital input signal level is high, then the analog output signal from the DAC is high, then the increased noise floor at the amplifier output will be acceptable, but if the output signal from the DAC is low, then the noise floor at the amplifier output, Vout, may not be acceptable.

To improve the noise floor at the amplifier output for lower signal levels, it is beneficial to reduce the transimpedance value and also to reduce the voltage gain. Implementation 3 is used for the large signals, and for lower signals, consider using implementation 2. The analog voltage gain is reduced by a factor of 2, and so the transimpedance is also reduced by a factor of 2. Hence the output noise floor voltage due to all three major noise sources is reduced by a factor of 2 or 6 dB. However, in order to maintain the digital to analog conversion characteristic, when using implementation 2 in place of implementation 3, the overall gain of the DAC must be increased compared to the DAC gain when using implementation 3. This is done by increasing the digital gain by a factor of 2. Hence, the digital signal value presented to the input of the DAC is increased by a factor of 2 and the analog gain of the transimpedance amplifier is decreased by a factor of 2, the overall system gain is therefore constant. The result is that the voltage noise is reduced by 6 dB in comparison to implementation 3 but the maximum output amplitude is limited to only half of that possible in implementation 3.

Furthermore, now consider using implementation 1 for very low signal levels. In this case, the analog gain is now reduced by a factor of 4 compared to implementation 2, and by a factor of 8 compared to implementation 3. Again, in order to maintain the digital to analog conversion characteristic, when using implementation 1 in place of implementation 3, the overall gain of the DAC must be increased compared to the DAC gain when using implementation 3.

This is done by increasing the digital gain by a factor of 8. Hence, the digital signal value presented to the input of the DAC is increased by a factor of 8 and the analog gain of the transimpedance amplifier is decreased by a factor of 8 compared to implementation 3. The result is that the DAC and resistor noise voltages are now both reduced by 8 times or 18 dB. Note however that the amplifier voltage gain did not reduce further from implementation 2, it is the same, so the noise from the amplifier input stage source reduces by only 6 dB compared to implementation 3 and not 18 dB. In this embodiment it will be difficult to realize the full 18 dB improvement due to the amplifier input becoming the dominant noise source and further reduction in transimpedance cannot reduce total noise much further. The point, however, is that by dynamically switching the gain of the transimpedance amplifier according to the signal level, and at the same time switching the digital gain of the input signal so as to maintain the same overall gain, the SNR performance can be optimized by lowering the noise floor for small signals.

The above description is used to illustrate the concept and different gains and different ratio of gains would be used for different applications and with various availabilities of power supply voltages, for example. Also it would not be necessary to physically switch between different transimpedance amplifiers, simply switching or adjusting the value of the resistor network in the amplifier circuit would suffice. This invention concerns the basic concept of switching between the analog and digital gains as required according to the level of the input signal and can be applied to a multitude of DAC applications, including but not limited to, voltage mode DACs, fully differential amps, single-ended-input amps, and for separate transimpedance and output driver stages. The invention can also be applied to applications that are not audio such as communication, video and sensors.

The switching between the analog and digital gains requires the ability to predict and respond to changes in the signal level and the switching should not introduce any perceivable distortions of the signal. This dynamic changing of gain is analogous to 'gears', that is the concept of changing from a high gear, when the application input is high, to a lower gear, when the application input is less. In order to switch gears between the required analog and digital gains it is necessary to predict and respond to changes in the signal level. Hence, according to this invention, any DAC system with an architecture that has two or more analog gains can be dynamically switched according to a predicted input and then simultaneously compensated by an accompanying equal but reciprocal change in the digital gain. To enable this change of gear a prediction algorithm can be used that chooses the gain and causes the switch to occur at a preferred time. Also a calibration algorithm may be used to ensure that the digital gain compensation is accurate in time and amplitude. This scheme results in both a low noise and a high output capability from the same system without any increase in supply power.

The action of switching the digital and analog gains is termed in this invention as "switching DAC gears". In order to cause the switching, a "Gear Switching Predictor" is required. When switching gears it is preferable that the transitions take place such that the output is least distorted and in order to achieve that, one option would be that the switching of the gears takes place at zero crossings of the signal when any gain mismatch error will not manifest itself in an output voltage step. There are several possible methods to predict the zero crossing including an analog comparator, a digital comparator, a digital infinite impulse response (IIR) predictor or a constant delay. A hysteresis for the gear shift threshold is also advantageous. It is necessary to predict and respond to a large amplitude in the next half-sine wave of the signal and it is also necessary to prevent switching down to a lower gear too quickly as this may cause harmonic switching and increased total harmonic distortion.

An additional benefit of reducing the analog gain when the signal is low stems from the tendency of many sigma-delta modulators to generate a parasitic spurious tone in the audio frequencies whenever the signal level is at certain ranges, typically a few percent around zero. This spurious tone, if in the frequency band of interest, raises the noise floor for small signals and certain DC offsets. By reducing the analog gain for low amplitude signals by switching to a lower gear, as presented in this invention, the spurious tones can be attenuated even to levels below the analog noise floor and effectively eliminated.

Figure 2A:
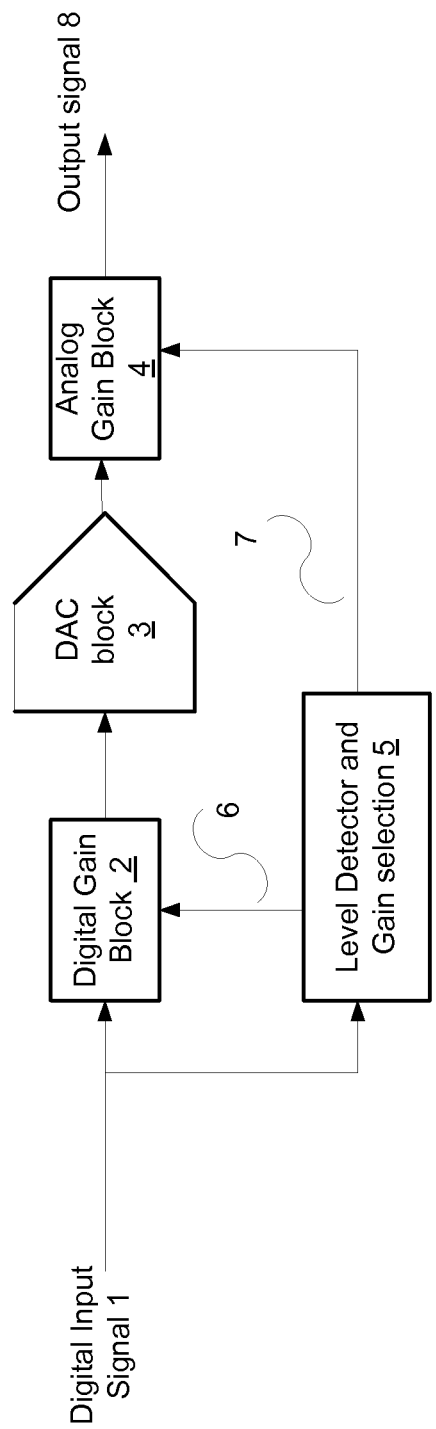
FIG. 2A is a block schematic diagram of the DAC circuit showing the digital and analog gain blocks

FIG. 2A is a block schematic of a digital to analog converter system according to an embodiment of the invention. The digital input 1 is applied to the input of the digital gain block, 2 and also the level detector and gain selector block 5. The output of the digital gain block is applied to the input of the DAC 3. DAC 3 and the analog gain block 4 perform the digital to analog conversion resulting in the analog output 8. The analog and the digital gains are controlled by the level detector and gain selector block 5.

The noise floor at the output of the analog gain block 4 is proportional to the gain of the amplification in the analog gain block 4. When the digital input level 1 is at the upper levels of its value, the analog gain 4 is set to its maximum value by the gain selection control in 5. If the amplitude of the digital input signal 1 becomes less, then the level detector in 5 determines if a lower analog gain can be used and if so will reduce the gain of the analog gain block 4. By reducing the analog gain the noise floor at the analog output 8 is also reduced. In order to maintain the same digital to analog conversion characteristic, the level detector and gain selection block 5 increases the digital gain in block 2. The digital gain is then increased by the same amount that the analog gain is decreased. By increasing the digital gain and reducing the analog gain, there is an improvement in the noise floor of the output signal 8 for this lower input signal level. The number of levels of gain steps that the level detector and gain selector block 5 can set can be two or more.

Figure 2B:
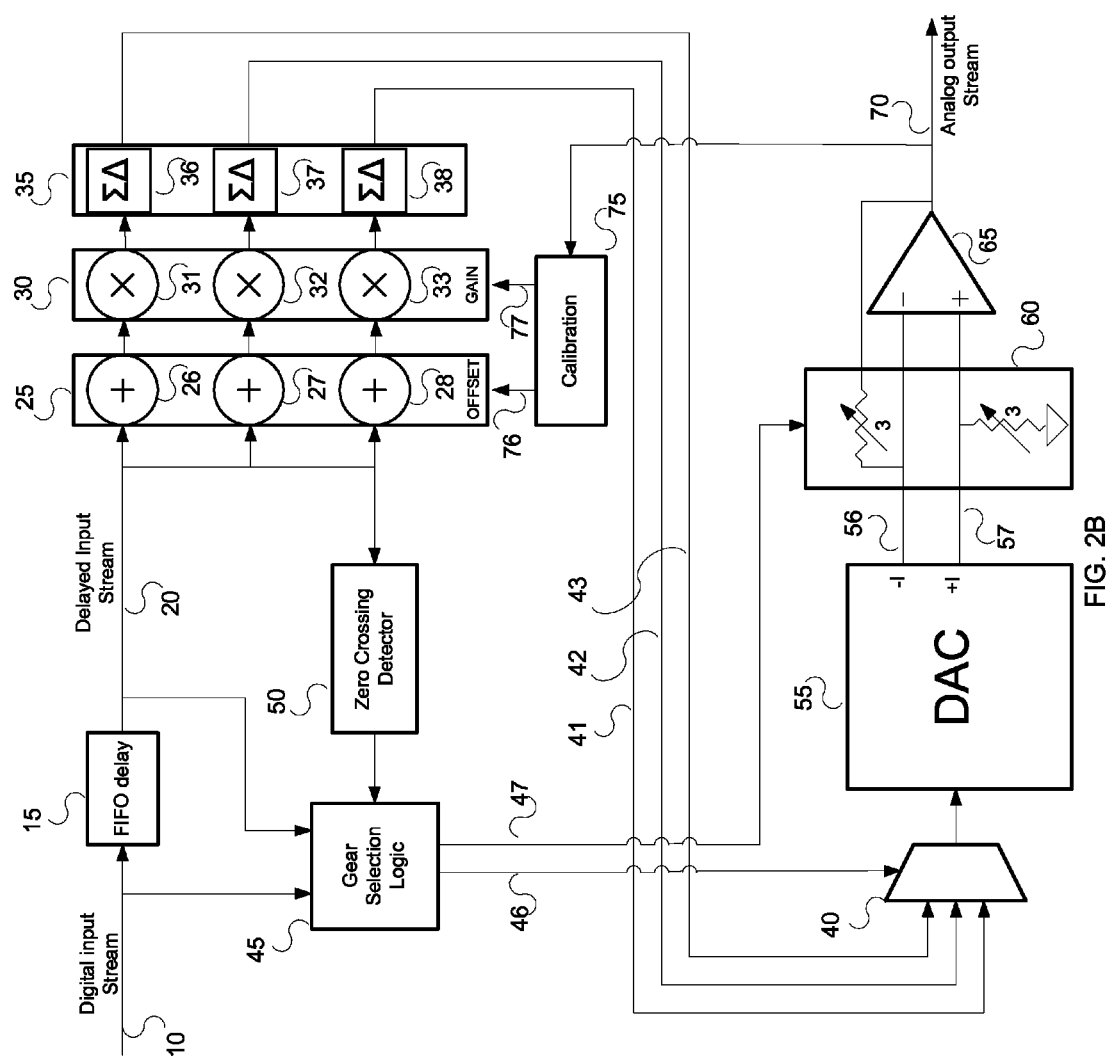
FIG. 2B is a block schematic diagram of an example system using the proposed DAC gear scheme.

FIG. 2B is a block schematic diagram of a digital to analog converter showing an embodiment of an implementation of the DAC gear scheme as described in this invention. The digital input stream 10 is applied to the input of a FIFO delay block 15 and also to the input of the gear selection logic block 45. The delayed input stream 20 that is at the output of the FIFO delay 15 is applied to the offset control block 25. The zero crossings of the delayed stream 20 are detected by the zero crossing detector 50. The output of the zero crossing detector 50 is also an input to the gear selection logic block 45. The offset and gain blocks, 25 and 30 respectively, adjust the offset and gain of the delayed digital input stream 20. In this example three digital streams are shown and the individual offset and gain adjustments blocks for each stream are 26 and 31, 27 and 32, 28 and 33 respectively. Each stream is then converted to a high frequency, low resolution bit stream by three sigma-delta modulators, 36, 37 and 38. In this embodiment, sigma-delta modulation is used, other DAC types may or may not use sigma-delta modulation.

The three low resolution bit stream outputs of the sigma-delta modulators, 41, 42, and 43 are then applied to the input of a multiplexer 40. The three digital bit streams, 41, 42 and 43 represent the same digital input signal but with different digital gains. For example, assuming that stream 41 is the same gain as the input stream 20, then stream 42 may have a value of 2 times that of stream 20, and stream 43 may have a value of 8 times stream 20. The multiplexer 40 is controlled by the digital gain selector output 46 of the gear selection logic block 45. The selected digital stream from the multiplexer 40 is applied to the input of the DAC 55. In this embodiment, a current-mode differential output DAC is shown, other DAC types may also be used.

The differential current outputs of the DAC, 56 and 57 are applied to the inputs of the transimpedance amplifier 60 and 65. The transimpedance and gain are selected in the feedback network block 60 together with the amplifier 65, the analog gain and the transimpedance value is selected by the analog gain selector output 47 from the gear selection logic block 45. The digital gain selection 46 is made so as to be the reciprocal to the analog gain selection 47: a decrease in analog gain is countered by an increase of digital gain. So, for example, if the relative gains of the three digital streams 41, 42 and 43 are 1, 2, and 8 respectively, as selected by control 46, then the relative analog gains as selected by control 47 will be 1, ½, and ⅛ respectively. The analog output 70 is also applied to the calibration block 75.

It is important that the analog gain changes are exactly matched by the digital gain changes such that the overall gain remains the same. Hence the gain values of the three digital streams, 31, 32, 33 may need to be calibrated so as to exactly counter the three analog gains as produced by the control signal 47 and the transimpedance block 60. The calibration block 75 performs the function of ensuring that the three digital gain blocks 31, 32 and 33 exactly counter the gain changes produced in the transimpedance block 60. This process may involve running a calibration routine or may be automatic. In addition, the calibration block 75 may also adjust the offsets 26, 27 and 28, for the three digital streams so as to correct any DC offsets introduced by switching of the analog gain.

Similarly, gain and offset calibration may be performed in the analog gain block instead of, or in addition to, the gains and offsets of the digital gain block. The digital gains can be fixed in this embodiment which has the advantage of replacing the digital multipliers with fixed bit-shift operations.

Again this process may be the result of running a calibration routine or may be made automatic. Thus, when the input signal level 10 is at a high level and the output signal 70 is therefore also at a high level, the analog gain of the transimpedance amplifier 60 and 65 will be selected so as to be at its highest. In this case the transimpedance value selected in block 60 will also be at its highest. This in turn results in the noise floor at the analog output 70 being at its highest but as the signal is also high the resultant noise floor can be as acceptable for the application. When the input signal 10 is at a low level, the output signal 70 will also be at a low level and in this case if the high transimpedance value was still being selected in 60 the noise floor would be relatively high and the resultant SNR reduced significantly. In this case, however, the gear selector logic block selects a lower analog gain in 60 and counters that with a corresponding higher digital gain from block 30. The overall gain remains the same but the reduction in transimpedance in block 60, results in a lower noise floor at the output 70 for small signals. The resultant SNR at the output 70 is now improved. The gear selection logic block 45 needs to make its decision such that the switching of the digital and analog gains causes negligible distortion in the analog output signal.

The selection is therefore preferably made when the digital signal 20 is at a zero crossing point. When switching at zero crossing, any gain mismatch between the analog and the digital gain does not manifest itself as a step in the output waveform. The gear selector logic block 45 uses the input digital stream 10 and the delayed input digital stream 20 in order to determine if the gains need to be changed and then, if a change is required, it will use the input from the zero crossing detector 50 to time the application of the change.

Is has been found that the digital and the analog gain factors may be altered regardless of the zero crossing and that the detection of the zero crossing is merely optional. It is also possible that the digital gain and offset values are constant and do not require calibration. FIG. 2C illustrates a digital to analog converter that does not include the zero crossing detector of FIG. 2B and has a constant value register 78 in place of the calibration block 75 of FIG. 2B.

Figure 2D:
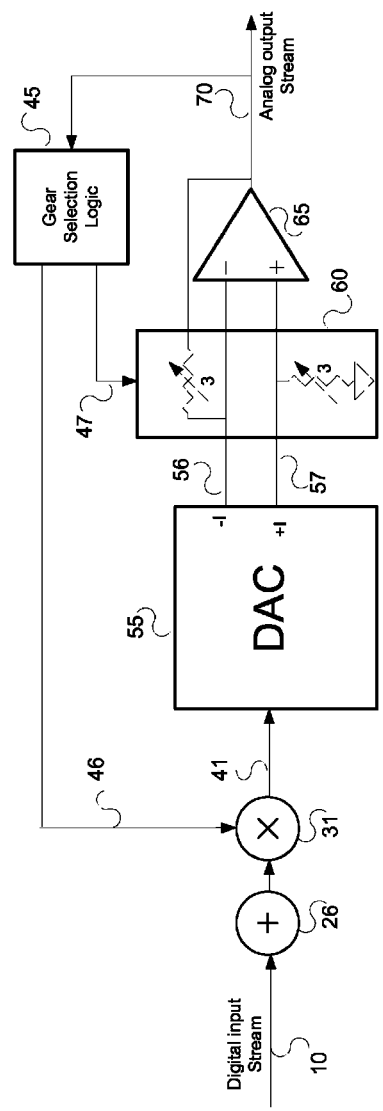
FIG. 2D is a block schematic diagram of a third embodiment using the proposed DAC gear scheme.

Another embodiment of the gear selector DAC is given in FIG. 2D. In this embodiment, the gear selector logic 45 bases the selection of digital gain 46 and of analog gain 47 on the analog value of the output voltage 70 rather than on the digital input stream 10 & 20 as in FIGS. 2B & 2C. Furthermore, for variance, in this embodiment there is only a single data stream 41 into the DAC, and no sigma-delta modulator, whereas the gear selector logic 45 directly controls the digital gain of digital gain block 31. It is apparent that a great number of combinations are possible and that the given embodiments are merely exemplary.

Figure 3:
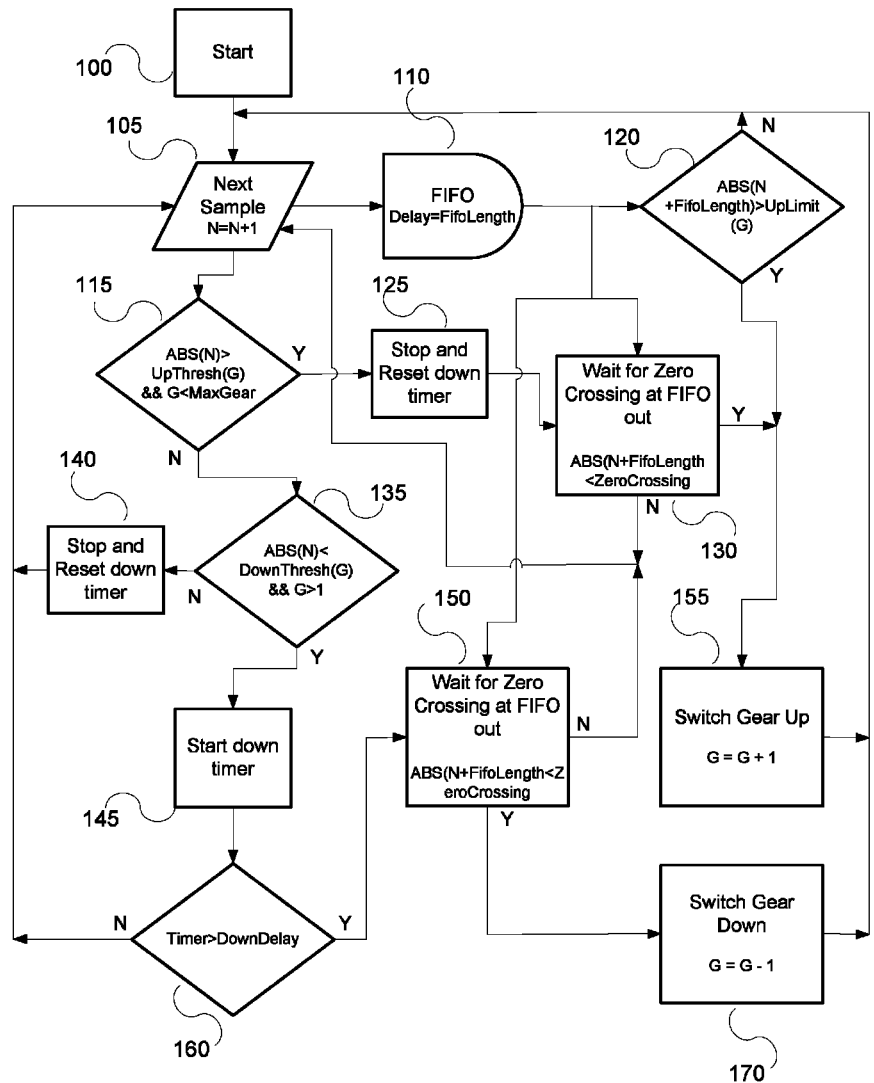
FIG. 3 is a flow chart diagram providing an example of the DAC gear switching algorithm.

FIG. 3 is a flow chart diagram providing an example of the DAC gear switching algorithm as could be used in the gear selection logic block 45 in FIG. 2B. The function of this algorithm is to detect when the digital and analog gains can be switched so as to provide the optimum SNR and introduce the least distortion at the analog output, 70 in FIG. 2B. This flowchart is provided as an outline of such an algorithm. Please note that the function blocks for the FIFO delay and the zero crossing detector, 15 and 50 in FIG. 2B respectively, as they are used in the algorithm flowchart, are included for clarity.

The convention used in this flowchart is that changing to a higher gear means that the analog gain, as described in FIG. 2A and FIG. 2B is switched so as to be a higher value, and the corresponding digital gain, as described in FIG. 2A and FIG. 2B is switched to a lower value. This corresponds to an increase in the digital input signal level 10 in FIG. 2B. After the start, step 100, the algorithm waits for the next input signal sample in step 105. This sample is obtained from the input digital stream 10 in FIG. 2B.

Once a new sample is obtained, in step 105, it is checked, in step 115, to determine if the value is above a threshold value that would cause a step up to a higher gear. If not, then in step 135 the level is checked to determine if the value is below a threshold that would cause a step down to a lower gear. In steps 115 and 135, checks are made to see if the highest or lowest gear, respectively, is already selected. If in step 135 the level is such that a lower gear is to be selected, then, in step 145, a timer, termed the down-timer is started. Step 160 checks if this timer is greater than the down delay and when it is it will send an input to step 150.

If at step 115, the threshold was exceeded, then in step 125, the down-timer is stopped and reset. The overall effect of the starting and stopping of the down-timer is to introduce some hysteresis such that the gear prediction algorithm does not switch back and forth every zero crossing on every half cycle. The inputs to steps 130 and 150, is after the digital input signal has been delayed by the FIFO, step 125.

Therefore the determination if the input signal is above or below the gear thresholds in steps 115 and 135 is carried out on the signal before the FIFO, step 110, and the action of waiting for the zero crossings in steps 130 and 150 is carried out on the delayed input signal after the FIFO. If, at step 130, the zero crossing is detected and the threshold signal from step 115, via step 125, is present, then in step 155, the gear is stepped up. Similarly, if at step 150, the zero crossing is detected and the threshold signal from step 135, via steps 145 and 160, is present, then as per step 170, the gear is stepped down. The algorithm will then return to step 105 to fetch the next sample.

If at step 135 the level is not less than the threshold, then no change in gears is required and the algorithm returns to step 105 after first stopping and resetting the down-timer in step 140. It is possible that either no zero crossing is detected in step 150 or the down timer 160 has not timed out before discovering that a step down should NOT be performed and in this case, the wait for a zero crossing step 150 is aborted by the reset in step 140 and the algorithm is returned to fetch the next sample step 105.

A special case exists where the signal level is determined to be greater than the maximum level available in the current gear without prior passing through zero crossing, this may happen with a step signal for example, and if this is detected in step 120, the gear is immediately stepped up without waiting for the zero crossing so as to avoid excess distortion of the analog signal output 70 in FIG. 2B.

As indicated above—the zero crossing is optional and the flow chart of FIG. 3 can be modified accordingly—for example by not including steps 130 and 150.

Figure 4:
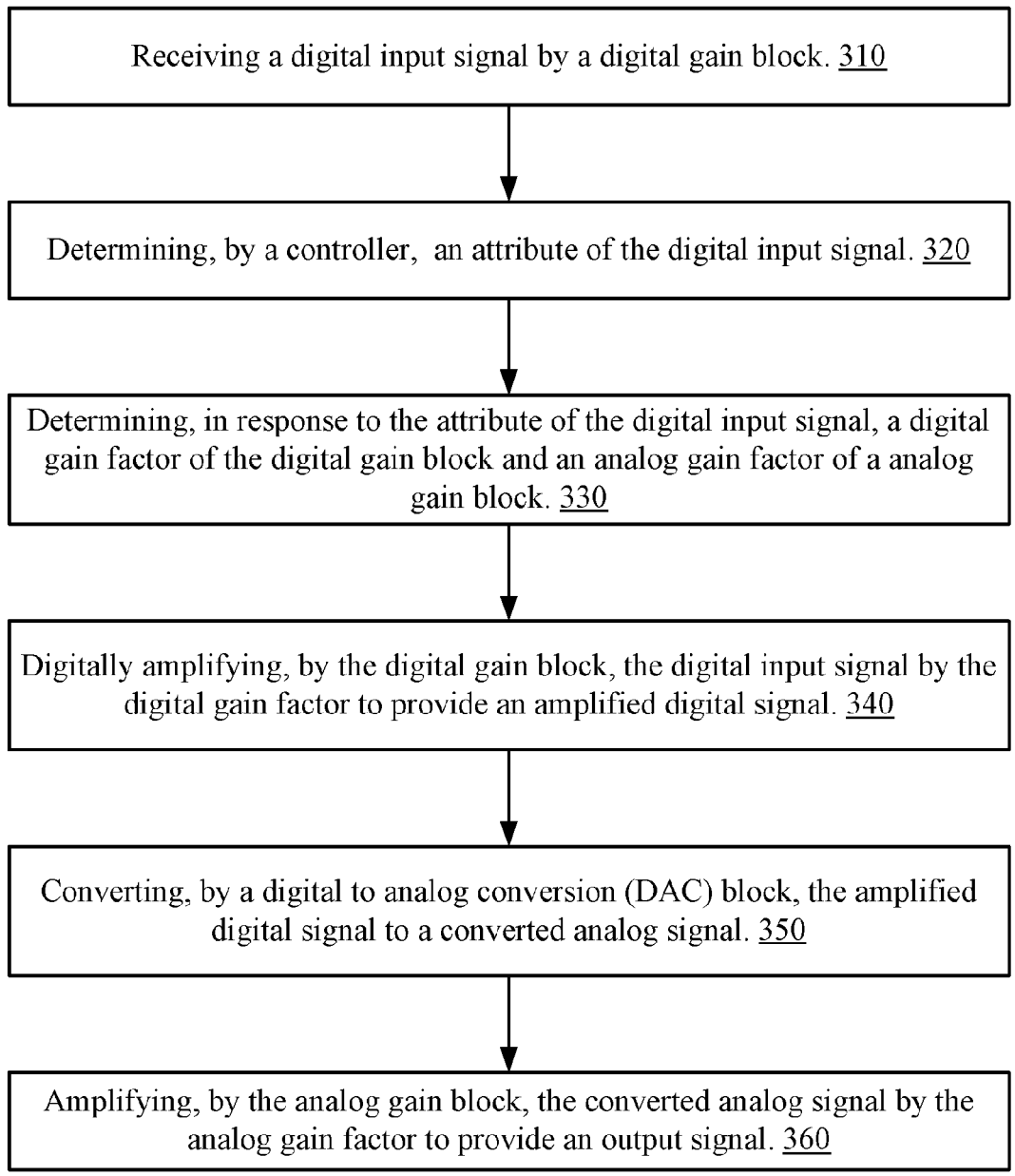
FIG. 4 is a flow chart of a method according to an embodiment of the invention.

FIG. 4 illustrates a method 300 according to an embodiment of the invention.

Method 300 may start by step 310 of receiving a digital input signal by a digital gain block.

Step 310 may be followed by step 320 of determining, by a controller, an attribute of the digital input signal.

Step 320 may be followed by step 330 of determining, in response to the attribute of the digital input signal, a digital gain factor of the digital gain block and an analog gain factor of a analog gain block.

Step 330 may be followed by step 340 of digitally amplifying, by the digital gain block, the digital input signal by the digital gain factor to provide an amplified digital signal.

Step 340 may be followed by step 350 of converting, by a digital to analog conversion (DAC) block, the amplified digital signal to a converted analog signal.

Step 350 may be followed by step 360 of amplifying, by the analog gain block, the converted analog signal by the analog gain factor to provide an output signal.

It is noted that the order of steps may change. For example step 340 of digitally amplifying may precede step 330 of determining the digital gain factor—especially when the digital gain block includes multiple digital gain paths and the determination of the digital gain factor involves selecting the best matching digital gain path. Referring to FIG. 2—the digital gain block includes three different digital multiplication paths (that provide three different digital gain-multiplied signals 41, 42 and 43) and the determining of the digital gain factor includes selecting (by control signal 46) which amplified digital signal to select.

| Reference numerals in the drawings | | | |
|---|---|---|---|
| 1 | Digital Input | 2 | Digital Gain Block |
| 3 | DAC | 4 | Analog Gain block |
| 5 | Level Detector and Gain Selector block | | |
| 6 | Digital Gain Control | 7 | Analog Gain Control |
| 8 | Analog Output | | |
| 10 | Digital Input stream | 15 | FIFO Delay |
| 20 | Delayed Input Stream | 25 | Digital offset calibration |
| 26, 27, 28 | Offset calibration blocks | 30 | Digital Gain calibration |
| 31, 32, 33 | Digital Gain Blocks | 35 | Digital Modulation |
| 36, 37, 38 | Modulation Blocks | 40 | Digital Multiplexer |
| 41, 42, 43 | Digital DAC input streams | 45 | Gear Selector logic block |
| 46 | Digital gain selector | 47 | Analog gain |

| Reference numerals in the drawings | | | |
|---|---|---|---|
| | control | | selector control |
| 50 | Zero Crossing Detector | | |
| 55 | DAC | 56, 57 | DAC differential outputs |
| 60 | Analog Selectable feedback network | | |
| 65 | Amplifier | 70 | Analog output |
| 75 | Calibration block | 76 | Offset controls |
| 77 | Digital gain controls | 78 | Static register values |
| 100-170 | Flowchart processes | | |
| 201 | DAC block | | |
| FR202, SR204, SR205 | feedback network resistors | | |
| 203 | operational amplifier | | |
| 310-360 | flowchart processes. | | |

While the above description contains many specifics, these should not be construed as limitations on the scope, but rather as an exemplification of several embodiments thereof. Many other variants are possible including, for examples, the number of gain steps used, the relative gain ratios used, the type of analog output amplifier used, the variations in DAC architectures, the use of alternatives to the delta sigma modulators to modulate the digital signal and the details of the gear selection logic algorithm. Accordingly the scope should be determined not by the embodiments illustrated, but by the claims and their legal equivalents.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A digital to analog converter comprising:
   a digital gain block;
   an analog gain block;
   a digital to analog conversion (DAC) block and
   a controller that is configured to:
      determine a digital gain factor, selected out of multiple digital gain factors, of the digital gain block and an analog gain factor, selected out of multiple analog gain factors of the analog gain block;
   wherein the DAC block is preceded by the digital gain block and is followed by the analog gain block;
   wherein the digital gain block is configured to multiply a digital input signal by the digital gain factor to provide an intermediate digital signal;
   wherein the DAC block is configured to convert the intermediate digital signal to a converted analog signal; and
   wherein the analog gain block is configured to multiply the converted analog signal by the analog gain factor to provide an output signal;
   wherein an increment of the analog gain factor results in a decrement of the digital gain factor.

2. The digital to analog converter according to claim 1 wherein a product of a multiplication of the analog gain factor by the digital gain factor approximately equals a predetermined constant.

3. The digital to analog converter according to claim 1 wherein the controller is configured to determine the digital gain factor in response to an attribute of at least one signal out of the digital input signal, the intermediate digital signal and the output signal.

4. The digital to analog converter according to claim 3 wherein the attribute is a level of the digital input signal.

5. The digital to analog converter according to claim 3 wherein the attribute is an amplitude of the digital input signal.

6. The digital to analog converter according to claim 3 wherein the attribute is a derivative of the digital input signal.

7. The digital to analog converter according to claim 1 wherein the digital to analog converter is configured to generate a first analog signal representative of the first digital input signal; wherein the controller is configured to determine the a digital gain factor in response to the first analog signal.

8. The digital to analog converter according to claim 1 wherein the digital gain block comprises multiple digital amplifying paths that have different digital gain factors; wherein the determination, by the controller, of the digital gain factor is followed by selecting a selected digital amplifying path of the multiple digital amplifying paths.

9. The digital to analog converter according to claim 1 wherein the analog gain block comprises an analog amplifying path that has an adjustable analog gain; wherein the determination, by the controller, of the analog gain factor is followed by adjusting the analog gain of the adjustable analog gain factor.

10. The digital to analog converter according to claim 1 wherein the controller is configured to determine whether to replace a previous value of the digital gain factor by a current value of the digital gain factor.

11. The digital to analog converter according to claim 10 wherein the controller is configured to determine a timing of the replacement of the previous value of the digital gain factor by the current value of the digital gain factor.

12. The digital to analog converter according to claim 10 wherein the controller is configured to determine the timing of the replacement in response to a level of digital input signal.

13. The digital to analog converter according to claim 10 wherein the controller is configured to determine the timing of the replacement in response to a timing of a zero crossing event during which a level of the digital input signal is about zero.

14. The digital to analog converter according to claim 10 wherein the controller is configured to set at least a predetermined period between consecutive replacements of values of the digital gain factor.

15. The digital to analog converter according to claim 10 wherein the controller is configured to set a first predetermined period prior to a decrement of the digital gain factor and set a second predetermined period prior to an increment of the digital gain factor.

16. The digital to analog converter according to claim 1 wherein the DAC block comprises the analog gain block.

17. The digital to analog converter according to claim 1 wherein the digital gain block comprises a gain multiplication circuit and an offset circuit for providing an offset signal to the input digital signal.

18. The digital to analog converter according to claim 1 wherein the digital gain block comprises a digital amplifying path that has an adjustable digital gain; wherein a determination, by the controller, of the digital gain factor is followed by adjusting the digital gain of the adjustable digital gain factor.

19. The digital to analog converter according to claim 1 wherein the analog gain block comprises multiple analog amplifying paths that have different analog gain factors; wherein the determination, by the controller, of the analog gain factor is followed by selecting a selected analog amplifying path of the multiple analog amplifying paths.

20. A method for digital to analog conversion, the method comprises:
   receiving a digital input signal by a digital to analog converter;
   determining, by a controller, a digital gain factor of the digital gain block and an analog gain factor of an analog gain block;

digitally multiplying, by the digital gain block, the digital input signal by the digital gain factor to provide an intermediate digital signal;

converting, by a digital to analog conversion (DAC) block, the intermediate digital signal to a converted analog signal; and multiplying, by the analog gain block, the converted analog signal by the analog gain factor to provide an output signal.

\* \* \* \* \*